(12) United States Patent
Funakubo

(10) Patent No.: US 7,592,738 B2
(45) Date of Patent: Sep. 22, 2009

(54) ULTRASONIC MOTOR

(75) Inventor: Tomoki Funakubo, Tokyo (JP)

(73) Assignee: Olympus Corporation, Tokyo (JP)

( * ) Notice: Subject to any disclaimer, the term of this patent is extended or adjusted under 35 U.S.C. 154(b) by 79 days.

(21) Appl. No.: 11/409,439

(22) Filed: Apr. 21, 2006

(65) Prior Publication Data
US 2006/0238072 A1    Oct. 26, 2006

(30) Foreign Application Priority Data
Apr. 26, 2005    (JP)    ............... 2005-128034

(51) Int. Cl.
*H01L 41/047*    (2006.01)
*H02N 2/04*    (2006.01)
(52) U.S. Cl. ................... 310/323.16; 310/366
(58) Field of Classification Search ........... 310/322, 310/328, 365, 366, 323.01–323.21
See application file for complete search history.

(56) References Cited

U.S. PATENT DOCUMENTS 6,806,620 B1 * 10/2004 Wischnewskiy ........ 310/323.02
7,119,476 B2 * 10/2006 Nagahama ............... 310/317
2004/0080243 A1 * 4/2004 Miyazawa ............... 310/328
2004/0189155 A1 * 9/2004 Funakubo ............... 310/366
2004/0239381 A1 * 12/2004 Matsuzaki et al. ....... 327/109

FOREIGN PATENT DOCUMENTS

JP            7-193291          7/1995

* cited by examiner

*Primary Examiner*—Walter Benson
*Assistant Examiner*—Derek J Rosenau
(74) *Attorney, Agent, or Firm*—Scully, Scott, Murphy & Presser, P.C.

(57) ABSTRACT

With the invention, both a longitudinal vibration mode and a flexural vibration mode are independently detected, or only the longitudinal vibration mode is detected, without using a special device. The invention provides an ultrasonic motor including electromechanical transducers for driving, electromechanical transducers for vibration detection, and an ultrasonic vibrator in which, by supplying two-phase alternating voltages with a predetermined phase difference and predetermined driving frequency to the electromechanical transducers for driving, two different vibration modes are simultaneously generated to produce a substantially elliptical vibration at an output. It is possible to independently detect both the longitudinal vibration mode and the flexural vibration mode with the electromechanical transducers for vibration detection.

2 Claims, 14 Drawing Sheets

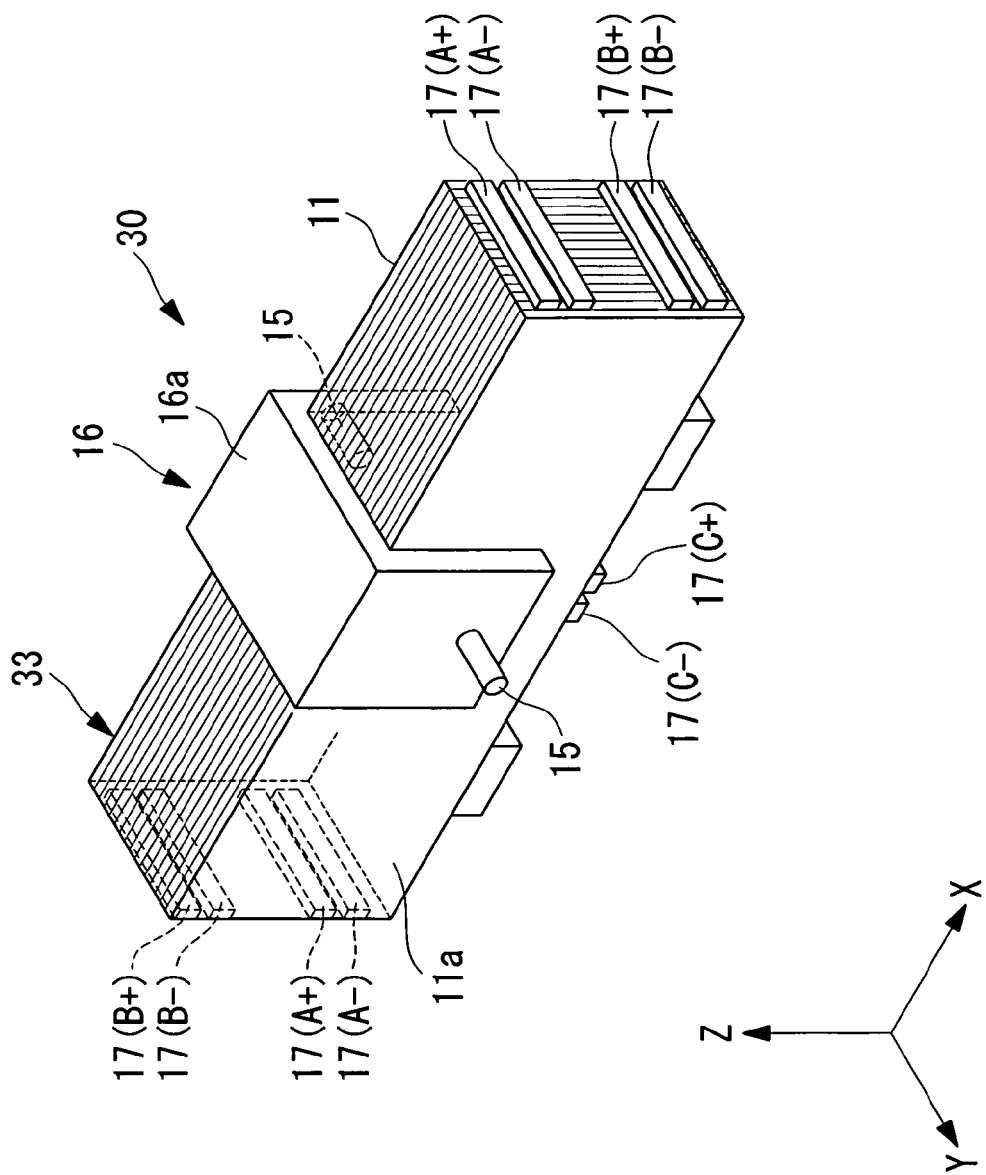

FIG. 12
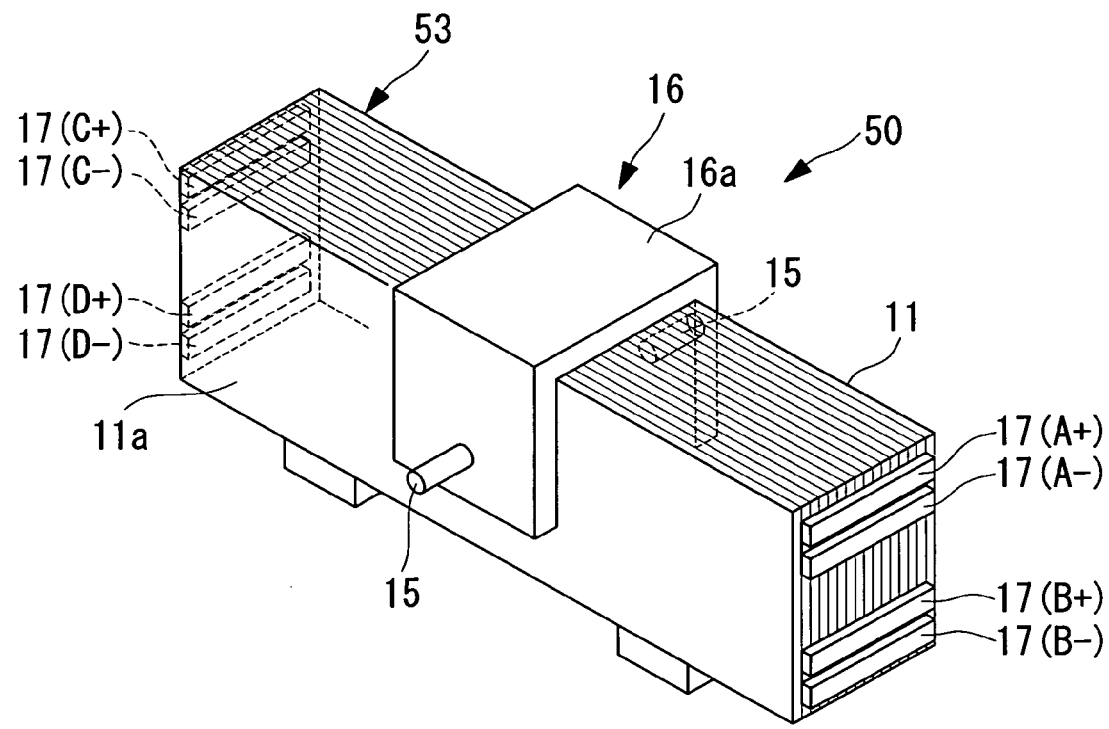
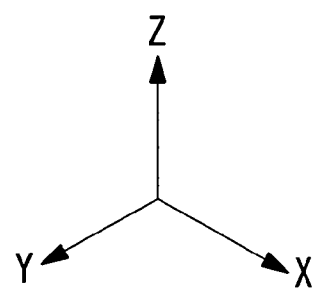

ULTRASONIC MOTOR

BACKGROUND OF THE INVENTION

1. Field of the Invention

The present invention relates to an ultrasonic motor.

2. Description of Related Art

Recently, ultrasonic motors have been drawing attention as a new type of motor replacing electromagnetic motors. Ultrasonic motors have the following advantages over known electromagnetic motors:

1) Ultrasonic motors are capable of high torque without using gears;
2) Ultrasonic motors have holding force when powered off;
3) Ultrasonic motors have high resolution;
4) Ultrasonic motors are quiet; and
5) Ultrasonic motors do not generate magnetic noise and are unaffected by noise.

A known ultrasonic motor is described in Japanese Unexamined Patent Application Publication No. HEI-7-193291. In the ultrasonic motor disclosed in Japanese Unexamined Patent Application Publication No. HEI-7-193291, internal electrodes for detecting vibrations are provided on some layered piezoelectric elements, which enables a vibration mode to be detected.

However, the vibration mode which can be detected using the ultrasonic motor in Japanese Unexamined Patent Application Publication No. HEI-7-193291 is only a flexural vibration mode generated in a cylindrical rod-shaped vibrator. Accordingly, in a vibrator that simultaneously generates a longitudinal vibration mode and a flexural vibration mode, each vibration mode cannot be independently detected using the internal electrodes disclosed in Japanese Unexamined Patent Application Publication No. HEI-7-193291; this is a problem because a separate, special device is thus required.

BRIEF SUMMARY OF THE INVENTION

The present invention has been conceived in light of the circumstances described above, and an object thereof is to provide an ultrasonic motor that can easily and independently detect both a longitudinal vibration mode and flexural vibration mode, or only the longitudinal vibration mode, without using a specially designed device.

In order to realize the object described above, the present invention provides the following solutions.

An ultrasonic motor according to a first aspect of the present invention includes electromechanical transducers for driving; electromechanical transducers for vibration detection; and an ultrasonic vibrator in which, by supplying two-phase alternating voltages with a predetermined phase difference and a predetermined driving frequency to the electromechanical transducers for driving, a longitudinal vibration mode and a flexural vibration mode are simultaneously generated to produce a substantially elliptical vibration at an output. It is possible to detect only the longitudinal vibration mode with the electromechanical transducers for vibration detection.

With the ultrasonic motor according to the first aspect of the invention, it is possible to easily detect only the longitudinal vibration mode without using a special device. Also, by setting the frequency close to the frequency where the amplitude of the longitudinal vibration of the vibrator is maximized, it is possible to drive the ultrasonic motor more efficiently, and it is possible to obtain a higher motor output.

In the ultrasonic motor according to the first aspect of the invention described above, the electromechanical transducers for vibration detection are preferably disposed across regions having electrical charges with the same sign in the longitudinal vibration mode and having electrical charges with different signs in the flexural vibration mode.

With this configuration, the electromechanical transducers for vibration detection are disposed at positions where the total of the electrical charges generated in each region due to the longitudinal vibration mode is finite and the electrical charges generated in each region due to the flexural vibration mode cancel out to make the total charge zero. This enables only the longitudinal vibration to be detected.

An ultrasonic motor according to a second aspect of the present invention includes electromechanical transducers for driving; electromechanical transducers for vibration detection; and an ultrasonic vibrator in which, by supplying two-phase alternating voltages with a predetermined phase difference and a predetermined driving frequency to the electromechanical transducers for driving, a longitudinal vibration mode and a flexural vibration mode are simultaneously generated to produce a substantially elliptical vibration at an output. It is possible to independently detect both the longitudinal vibration mode and the flexural vibration mode with the electromechanical transducers for vibration detection.

With the ultrasonic motor according to the second aspect of the invention, it is possible to easily detect both the longitudinal vibration mode and the flexural vibration mode independently, without using a special device. Also, by setting the frequency close to the frequency where the amplitude of the longitudinal vibration of the vibrator is maximized, it is possible to drive the ultrasonic motor more efficiently, and it is possible to obtain a higher motor output.

In the ultrasonic motor according to the second aspect of the invention described above, preferably, the electromechanical transducers for vibration detection are respectively disposed in regions having electrical charges with the same sign in the longitudinal vibration mode and having electrical charges with different signs in the flexural vibration mode.

With this configuration, the electromechanical transducers for vibration detection are disposed at positions where the total of the electrical charges generated in each region due to the longitudinal vibration mode is finite and the difference between the charges generated in each region due to the longitudinal vibration mode is zero, and in addition, where the total of the electrical charges generated in each region due to the flexural vibration is zero and the difference between the charges generated in each region due to the flexural vibration is finite. Accordingly, the longitudinal vibration mode can be detected by calculating the sum of potentials generated in each of these regions, and the flexural vibration mode can be detected by calculating the difference between the potentials generated in these regions. Thus, it is possible to easily detect both the longitudinal vibration mode and the flexural vibration mode independently.

The present invention provides the advantage that it is possible to easily detect both the longitudinal vibration mode and the flexural vibration mode independently, or to detect only the longitudinal vibration mode, without using a special device.

BRIEF DESCRIPTION OF THE SEVERAL VIEWS OF THE DRAWINGS

FIG. 8 is a perspective view showing an ultrasonic vibrator in an ultrasonic motor according to a second embodiment of the present invention.

FIG. 12 is a perspective view showing an ultrasonic vibrator in an ultrasonic motor according to a fourth embodiment of the present invention.

DETAILED DESCRIPTION OF THE INVENTION

An ultrasonic motor according to a first embodiment of the present invention will be described below with reference to FIGS. 1 to 7C.

Figure 1:
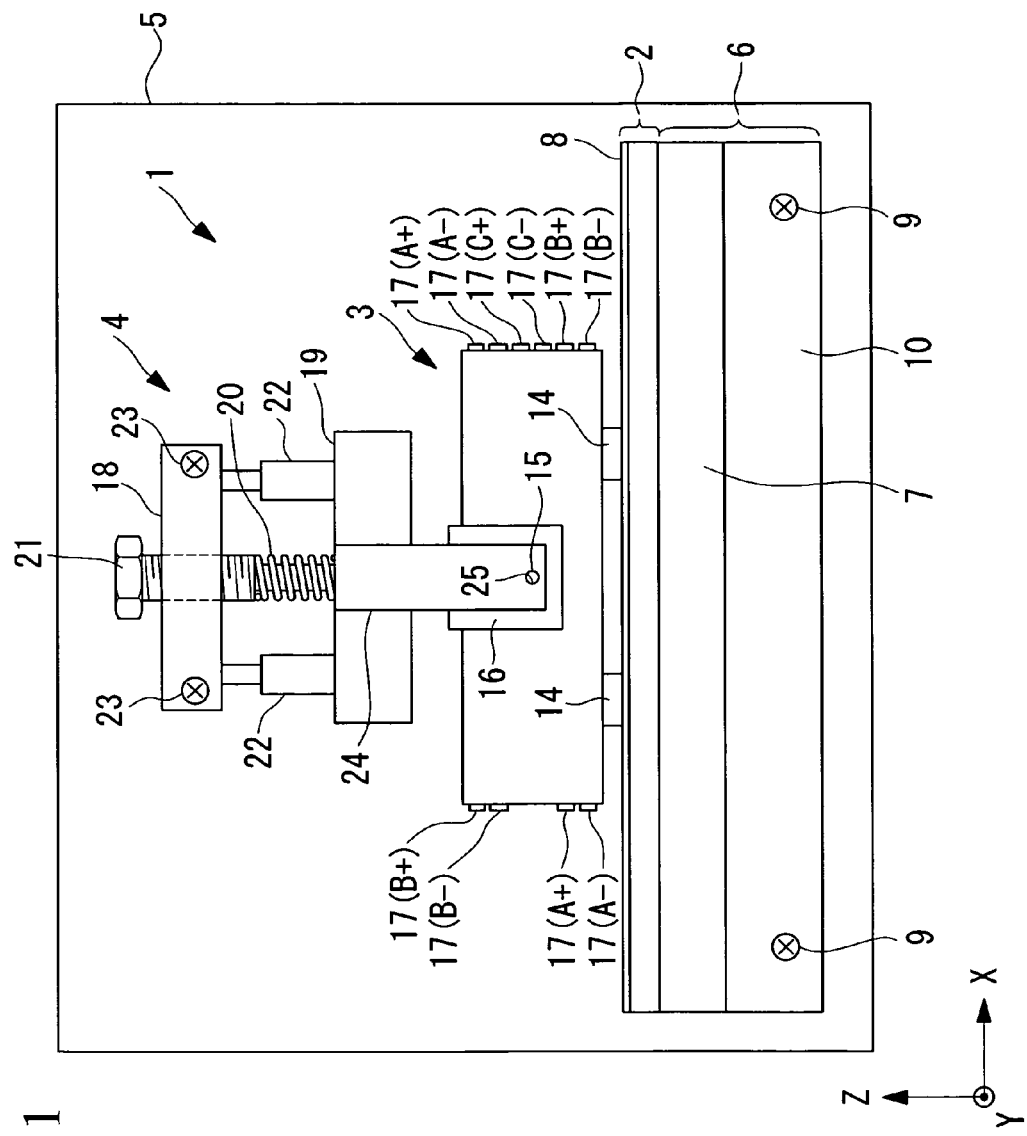
FIG. 1 is an overall schematic diagram showing an ultrasonic motor according to a first embodiment of the present invention.
Figure 2:
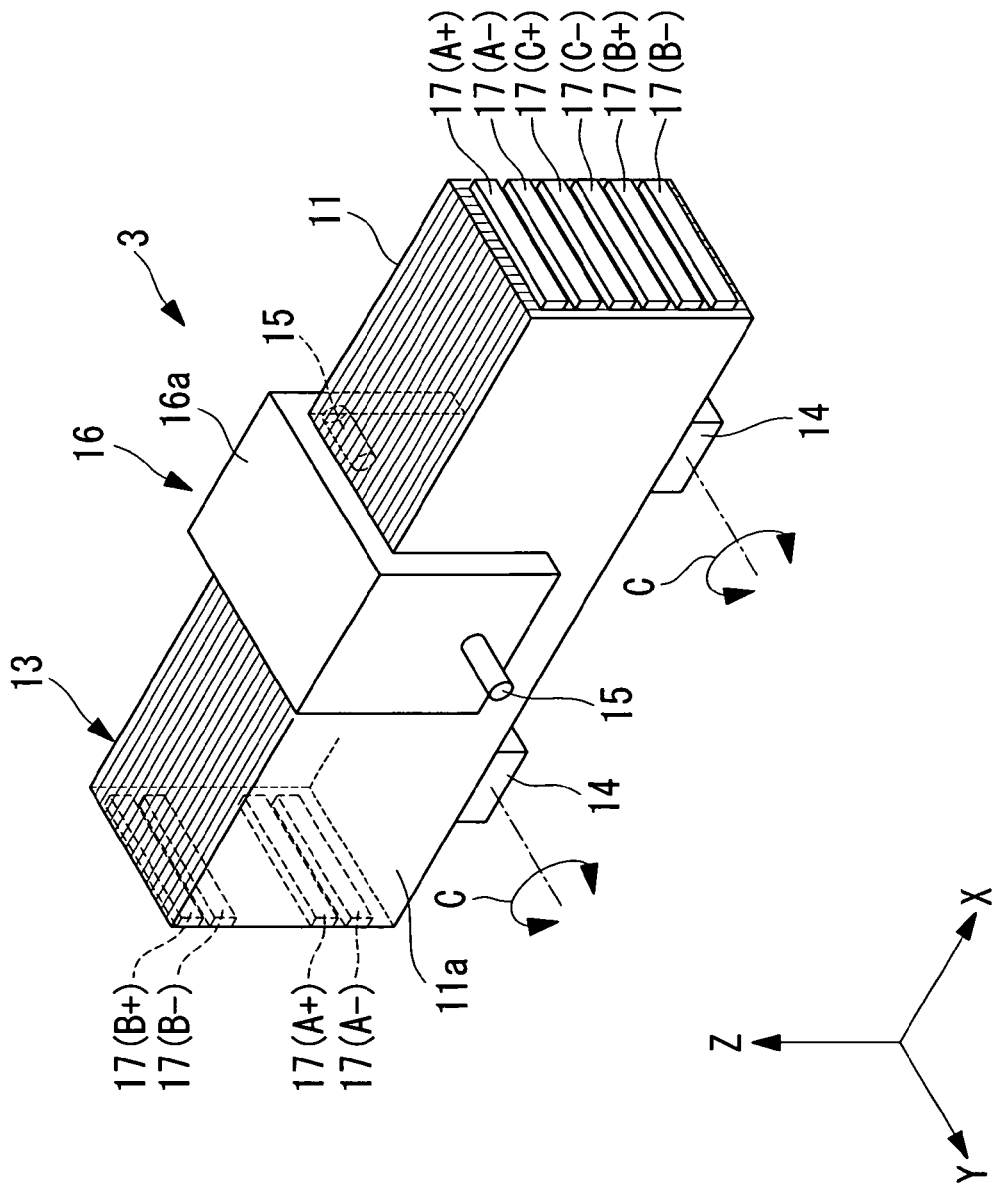
FIG. 2 is a perspective view showing an ultrasonic vibrator in the ultrasonic motor in FIG. 1.

As shown in FIG. 1, an ultrasonic motor 1 according to this embodiment includes a driven body 2, an ultrasonic vibrator 3 disposed in contact with the driven body 2, and a pressing unit 4 for pressing the ultrasonic vibrator 3 against the driven body 2. The driven body 2 is fixed to a movable member 7 of a linear bearing 6, which is secured to a base 5. A sliding plate 8 made of, for example, zirconia ceramic is bonded to the driven body 2 on the surface contacting the ultrasonic vibrator 3. Screws 9 secure a fixed member 10 of the linear bearing 6 to the base 5.

As shown in FIGS. 2 to 4B, the ultrasonic vibrator 3 includes a rectangular-block-shaped piezoelectric layered member 13, two friction-contact members (output terminals) 14 bonded to one side surface of the piezoelectric layered member 13, and a vibrator holding member 16. The piezoelectric layered member 13 is made up of a stack of rectangular piezoelectric ceramic sheets (electromechanical transducers) 11. On one side of each of the piezoelectric ceramic sheets 11, sheets of inner electrodes 12 are provided (refer to FIGS. 4A and 4B). The vibrator holding member 16 has pins 15 projecting from side surfaces adjacent to the side surface on which the friction-contact members 14 are provided.

Figure 3:
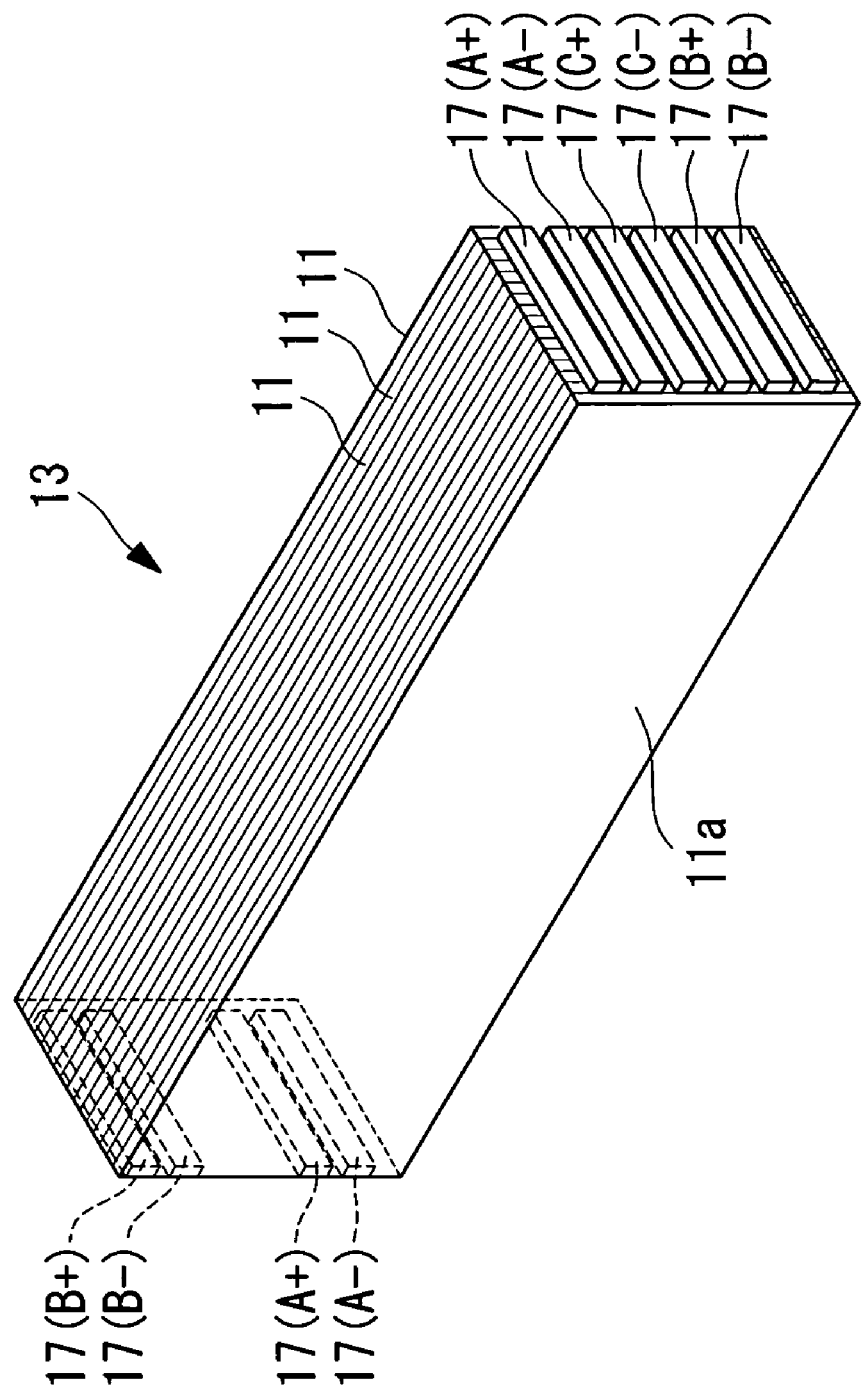
FIG. 3 is a perspective view showing a piezoelectric layered member constituting the ultrasonic vibrator in FIG. 2.

As shown in FIG. 3, the outer dimensions of the piezoelectric layered member 13 are, for example, a length of 18 mm, a width of 4.4 mm, and a thickness of 2 mm.

Figure 4A:
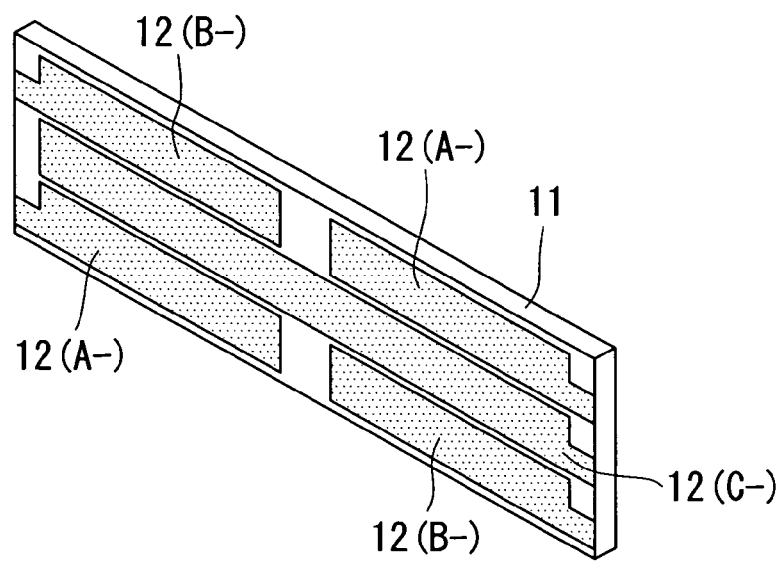
FIG. 4A is a perspective view showing a piezoelectric ceramic sheet constituting the piezoelectric layered member in FIG. 3.
Figure 4B:
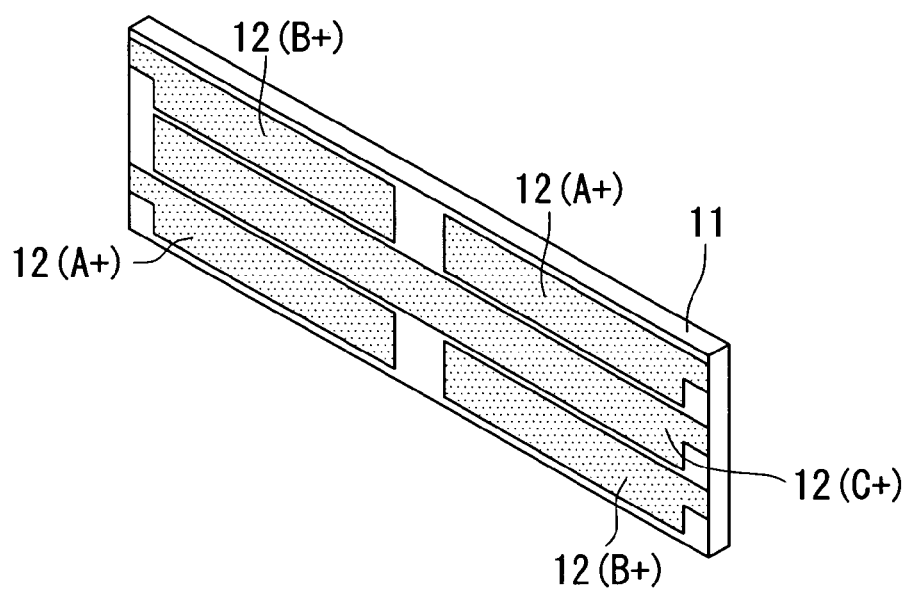
FIG. 4B is a perspective view showing a piezoelectric ceramic sheet constituting the piezoelectric layered member in FIG. 3.

As shown in FIGS. 4A and 4B, the piezoelectric ceramic sheets 11 constituting the piezoelectric layered member 13 are, for example, lead zirconate titanate (hereinafter referred to as PZT) piezoelectric ceramic elements having a thickness of about 80 μM. For the PZT, a hard-type PZT having a large Qm value is selected. The Qm value is about 1,800.

The inner electrodes 12, for example, are composed of silver-palladium alloy and have a thickness of about 4 μm. A piezoelectric ceramic sheet 11a disposed at one end in the layering direction does not have any inner electrodes 12. The other piezoelectric ceramic sheets 11 include two different types of inner electrodes 12. The two different types of inner electrodes 12 are illustrated in FIGS. 4A and 4B.

The piezoelectric ceramic sheets 11 shown in FIGS. 4A and 4B have the inner electrodes 12 over substantially the entire surfaces thereof. The inner electrodes 12 include one inner electrode disposed along the longitudinal direction of the ceramic sheet 11 at the central area in the width direction of the ceramic sheet 11 and four internal electrodes of substantially the same size disposed around the central electrode. The four surrounding inner electrodes are separated from the central electrode by insulating distances of about 0.4 mm in the width direction of the piezoelectric ceramic sheet 11 and are separated by insulating distances of about 0.4 mm in the longitudinal direction of the piezoelectric ceramic sheet 11. The inner electrodes 12 are disposed with a gap of about 0.4 mm from the edges of the piezoelectric ceramic sheet 11, and portions thereof extend to the edges of the piezoelectric ceramic sheet 11.

The rectangular block-shaped piezoelectric layered member 13 is formed by alternately laminating the piezoelectric ceramic sheets 11 shown in FIGS. 4A and 4B, which are provided with these inner electrodes 12.

A total of ten external electrodes 17 are provided on the piezoelectric layered member 13, six on one end face in the longitudinal direction and four on the other end face in the longitudinal direction. The external electrodes 17 are each connected to a group of inner electrodes 12 provided at the same position on the same type of piezoelectric ceramic sheets 11. In this way, the inner electrodes 12 provided at the same position on the same type of piezoelectric ceramic sheets 11 have the same electric potential. The external electrodes 17 are connected to a controller (not shown in the drawings) via wiring lines (not shown in the drawings). The wiring lines may be any type of flexible wiring, such as lead wires or flexible substrates.

The piezoelectric layered member 13 is manufactured, for example, as described below.

To manufacture the piezoelectric layered member 13, first, the piezoelectric ceramic sheets 11 are prepared. The piezoelectric ceramic sheets 11 are prepared, for example, by casting a slurry mixture of a calcinated powder of PZT and a predetermined binder onto a film using a doctor blade method, drying the mixture, and removing the dried mixture from the film.

The material for the inner electrodes 12 is printed on each of the prepared piezoelectric ceramic sheets 11 using a mask having a pattern for the inner electrode 12. First, the piezoelectric ceramic sheet 11a with no inner electrode 12 is provided. Then, the two types of piezoelectric ceramic sheets 11 having different-shaped inner electrodes 12 are carefully aligned and alternately stacked on the piezoelectric ceramic sheet 11a with the inner electrodes 12 facing downward towards the piezoelectric ceramic sheet 11a. The stacked piezoelectric ceramic sheets 11 are bonded by thermocompression, cut into a predetermined shape, and fired at a temperature of about 1,200° C. In this way, the piezoelectric layered member 13 is manufactured.

Subsequently, silver is plated onto the inner electrodes 12 exposed at the edges of the piezoelectric ceramic sheets 11 such that the inner electrodes 12 are joined together to form the external electrodes 17.

Finally, a direct-current (DC) high voltage is applied between the opposing inner electrodes 12 to polarize and piezoelectrically activate the piezoelectric ceramic sheets 11.

Next, the operation of the piezoelectric layered member 13, manufactured by the above-described process, will be described.

The six external electrodes 17 formed at one end in the longitudinal direction of the piezoelectric layered member 13 are A-phase (A+ and A−), C-phase (C+ and C−), and B-phase (B+ and B−) electrodes in this order from the other side face (the top side in FIG. 2) of the piezoelectric layered member 13, and the four external electrodes 17 formed at the other end are B-phase (B+ and B−) and A-phase (A+ and A−) electrodes in this order from the other side face (the top side in FIG. 2) of the piezoelectric layered member 13. The A-phase and B-phase external electrodes are for driving, and the C-phase external electrodes are for vibration detection.

Figure 5:
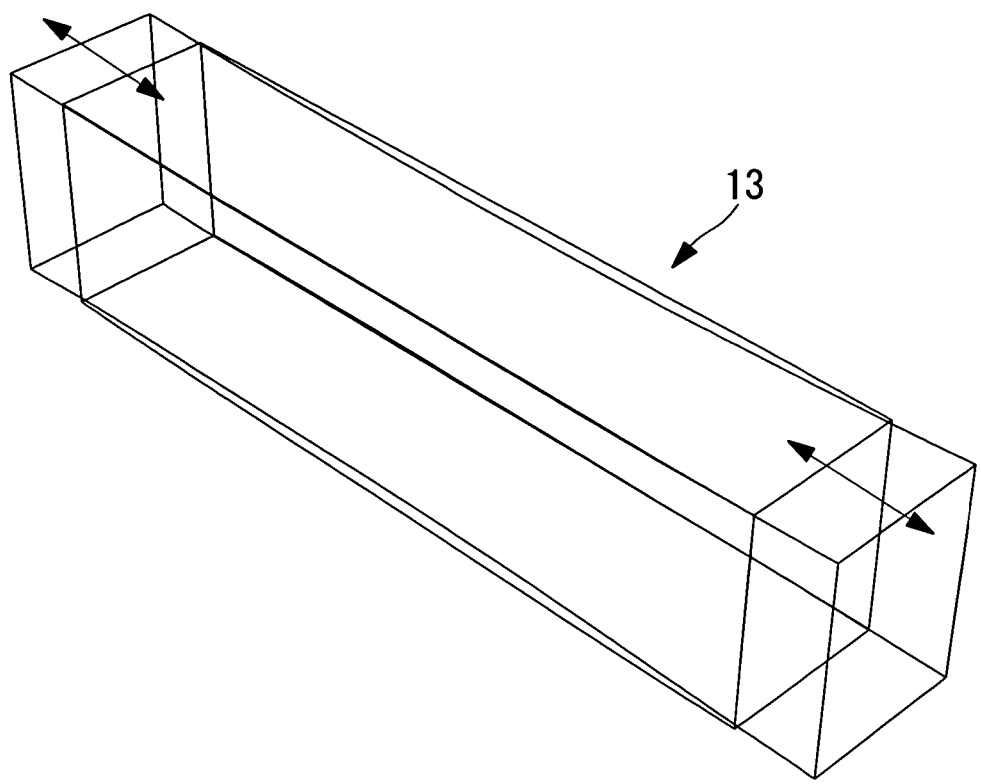
FIG. 5 is a diagram illustrating a computer analysis of the vibration of the piezoelectric layered member in FIG. 2 in a first-order longitudinal vibration mode.
Figure 7A:
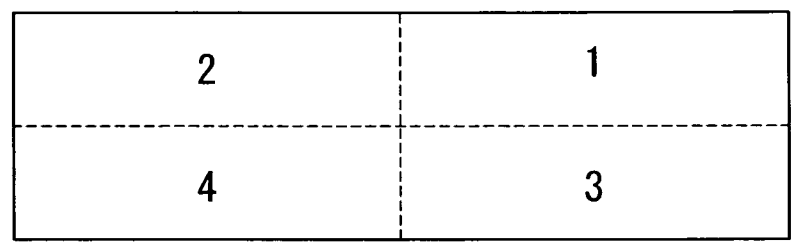
FIG. 7A is a diagram for explaining the charges generated in internal electrodes provided on a ceramic sheet, wherein the ceramic sheet is divided into four regions having the same shape (rectangular) and the same area.
Figure 7B:
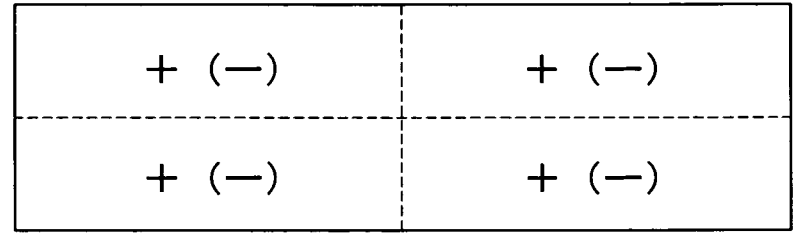
FIG. 7B is a diagram for explaining the charges generated in internal electrodes provided on a ceramic sheet, showing the charges generated in each region when the longitudinal vibration mode is excited.

By applying alternating-current (AC) voltages corresponding to resonant frequencies and having synchronous phases to the A-phase and B-phase external electrodes 17, a first-order longitudinal vibration is excited, as illustrated in FIG. 5. At this time, if the piezoelectric ceramic sheets 11 described above are divided into four regions having the same shape (rectangular) and the same area, as shown in FIG. 7A, and the signs of the charges in each region are measured, the resulting charges in each region are as shown in FIG. 7B. In other words, when a longitudinal vibration mode is excited, positive charges are excited in all regions simultaneously, or negative charges are excited in all regions simultaneously.

Figure 6:
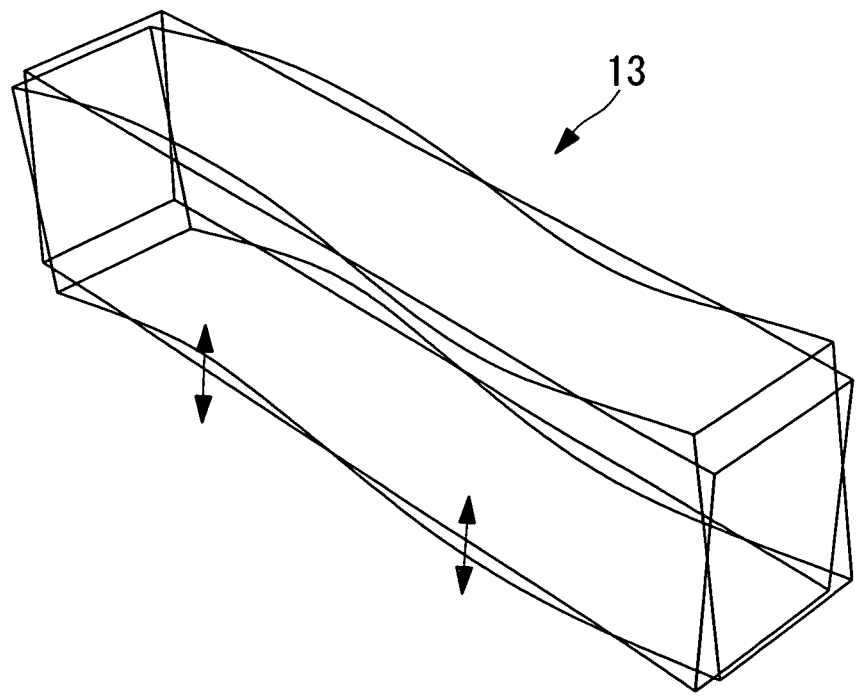
FIG. 6 is a diagram illustrating a computer analysis of the vibration of the piezoelectric layered member in FIG. 2 in a second-order flexural vibration mode.
Figure 7C:
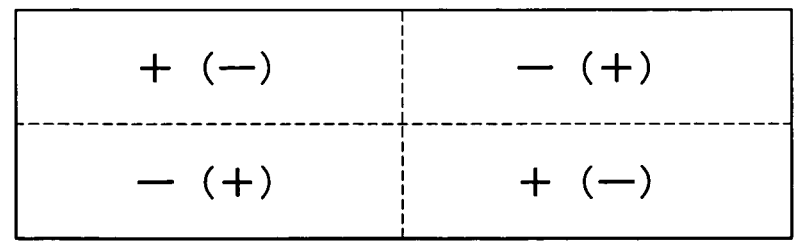
FIG. 7C shows the charges generated in each region when the flexural vibration mode is excited.

By applying AC voltages corresponding to the resonant frequencies and having opposite phases to the A-phase and B-phase external electrodes 17, a second-order flexural vibration is excited, as illustrated in FIG. 6. The charges in each region at this time are as shown in FIG. 7C. In other words, when a flexural vibration mode is excited, among the four regions, charges having the same sign are simultaneously excited in the regions positioned diagonally opposite each other, and charges having different signs are simultaneously excited in neighboring regions.

Then, the charges in each of these regions are output to the controller mentioned above via the C-phase external electrodes 17, and the charges are processed in this controller.

The signs of the charges excited can be determined by the phase conditions of the vibrations.

The friction-contact members 14 are bonded on the piezoelectric layered member 13 at two positions corresponding to the antinodes of the second-order flexural vibration. In this way, the friction-contact members 14 are displaced in the longitudinal direction of the piezoelectric layered member 13 (that is, the X direction in FIG. 2) when a first-order longitudinal vibration is generated in the piezoelectric layered member 13. On the other hand, the friction-contact members 14 are displaced in the width direction of the piezoelectric layered member 13 (that is, the Z direction in FIG. 2) when a second-order flexural vibration is generated in the piezoelectric layered member 13.

Consequently, by applying 90-degree phase-shifted AC voltages corresponding to the resonant frequencies to the A-phase and B-phase external electrodes 17 of the ultrasonic vibrator 3, the first-order longitudinal vibration and the second-order flexural vibration are generated simultaneously. As a result, substantially elliptical vibrations in a clockwise or counterclockwise direction are generated at the friction-contact members 14, as indicated by the arrows C in FIG. 2.

The vibrator holding member 16 includes a holding part 16a having a substantially angular-U shape in cross section and the pins 15, integral with the holding part 16a, which project perpendicularly from both sides of the holding part 16a. The holding part 16a covers the piezoelectric layered member 13 from one side in the width direction thereof and is bonded to the piezoelectric layered member 13 with, for example, a silicone resin or an epoxy resin. When the holding part 16a is bonded to the piezoelectric layered member 13, the two pins 15 integrally provided on the sides of the holding part 16a are coaxially disposed at the position of a common node of the longitudinal vibration and the flexural vibration of the piezoelectric layered member 13.

The pressing unit 4, as illustrated in FIG. 1, includes a bracket 18, a pressing unit 19, a coil spring 20, an adjustment screw 21, and guiding bushes 22. The bracket 18 is fixed on the base 5 with screws 23 at a position a predetermined distance away from the ultrasonic vibrator 3 in the width direction (Z direction) on the opposite side of the ultrasonic vibrator 3 from the friction-contact members 14. The pressing unit 19 is supported so that it is movable in the width direction of the ultrasonic vibrator 3 with respect to the bracket 18. The coil spring 20 applies a pressing force to the pressing unit 19, and the adjustment screw 21 adjusts the pressing force. The guiding bushes 22 guide the movement of the pressing unit 19 with respect to the bracket 18. Reference numeral 23 is a screw for securing the bracket 18 to the base 5.

The pressing unit 19 includes two support plates 24 sandwiching the ultrasonic vibrator 3 in the thickness direction thereof. The support plates 24 each have a through-hole 25 for passing the pins 15 of the vibrator holding member 16. The pressing force applied to the pressing unit 19 is transmitted to the ultrasonic vibrator 3 through the support plates 24 and the pins 15 passing through the through-holes 25.

The coil spring 20 is a compression coil spring interposed between the adjustment screw 21 and the pressing unit 19. By changing the fastening position of the adjustment screw 21 with respect to the bracket 18, the amount of elastic deformation of the coil spring 20 is changed so as to change the pressing force applied to the pressing unit 19 in a direction toward the ultrasonic vibrator 3.

Now, the operation of the ultrasonic motor 1 according to this embodiment, having the above-described structure, will be described below.

To operate the ultrasonic motor 1 according to this embodiment, high-frequency voltages (A-phase and B-phase) having a phase difference of 90 degrees are supplied to the A-phase and B-phase external electrodes 17 via the wires connected to the external electrodes 17.

In this way, substantially elliptic vibrations, which are a combination of the longitudinal vibration mode and the flexural vibration mode, are generated at the friction-contact members 14 bonded to the ultrasonic vibrator 3. The driven body 2 is driven by the frictional force generated between the ultrasonic vibrator 3 and the sliding plate 8 of the driven body 2 in the tangential direction of the elliptic vibrations.

With the ultrasonic motor 1 according to this embodiment, because the total of the charges generated in the regions by the longitudinal vibration mode is finite and because the C-phase electrodes (the inner electrodes 12 for vibration detection) are disposed at positions where the charges generated in the regions by the flexural vibration mode cancel out and the total charge becomes zero, it is possible to detect only the longitudinal vibration mode via these C-phase electrodes (the inner electrodes 12 for vibration detection).

Also, by setting the frequency close to a frequency where the amplitude of the longitudinal vibration of the vibrator is maximized, it is possible to drive the ultrasonic motor more efficiently, and a high motor output can be obtained.

An ultrasonic motor according to a second embodiment of the present invention is described below with reference to FIGS. 8 to 9B.

Figure 9A:
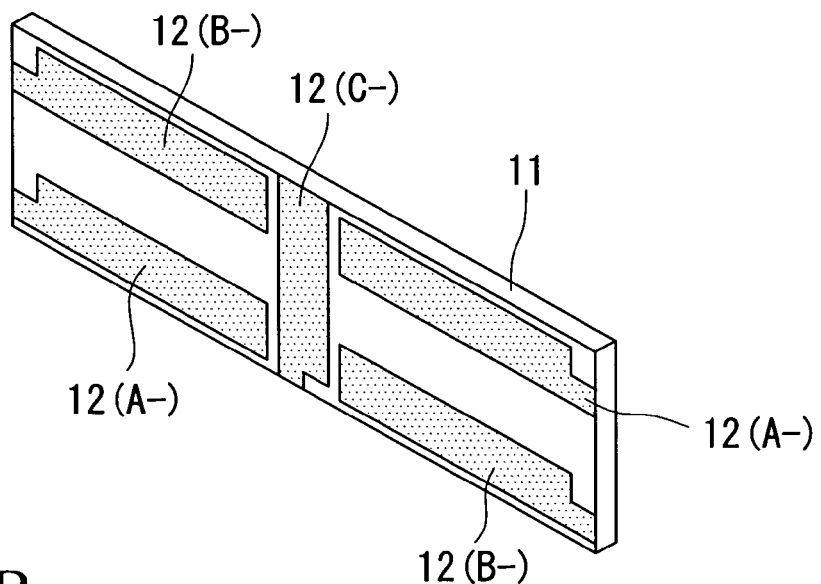
FIG. 9A is a perspective diagram showing a piezoelectric ceramic sheet constituting a piezoelectric layered member in FIG. 8.
Figure 9B:
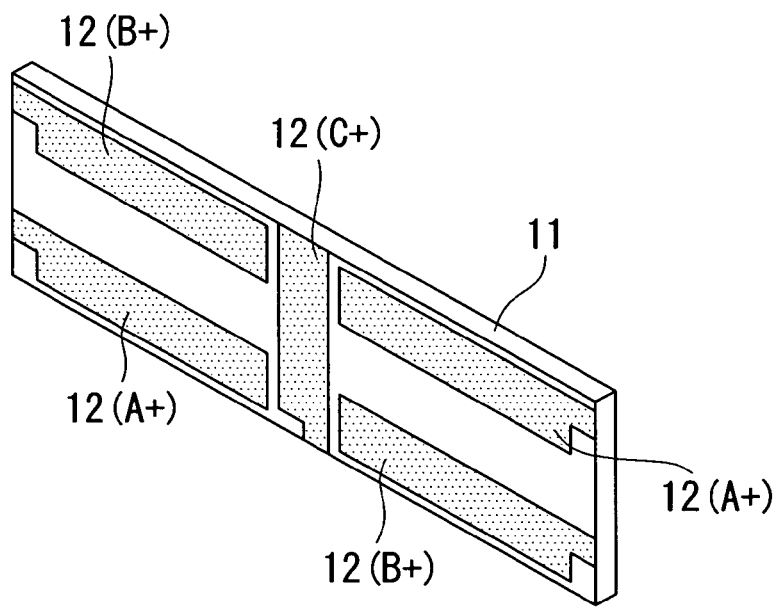
FIG. 9B is a perspective diagram showing a piezoelectric ceramic sheet constituting the piezoelectric layered member in FIG. 8.

As shown in FIGS. 9A and 9B, the ultrasonic motor according to this embodiment differs from the ultrasonic motor 1 according to the first embodiment described above in that it includes an ultrasonic vibrator 30 in which inner electrodes for vibration detection are disposed at the central area in the longitudinal direction of the ceramic sheets 11 so as to be parallel to the width direction of the ceramic sheets 11.

With the ultrasonic motor according to this embodiment, it is possible to simplify the construction of the inner electrodes 12, and it is also possible to simplify the construction of a piezoelectric layered member 33.

Other effects and advantages are the same as those in the first embodiment described above, and a description thereof is thus omitted.

An ultrasonic motor according to a third embodiment of the present invention will be described below with reference to FIGS. 10 to 11B.

Figure 10:
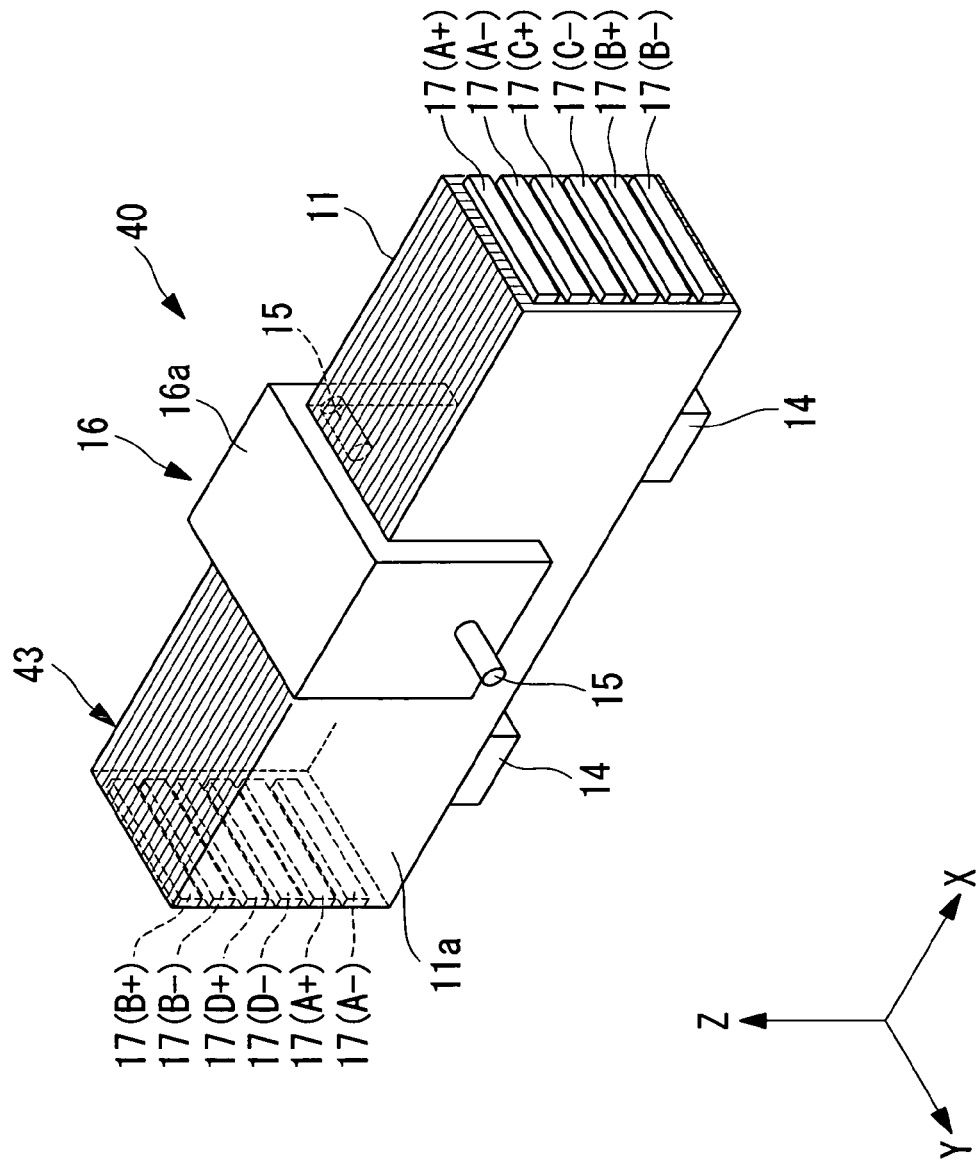
FIG. 10 is a perspective view showing an ultrasonic vibrator in an ultrasonic motor according to a third embodiment of the present invention.
Figure 11A:
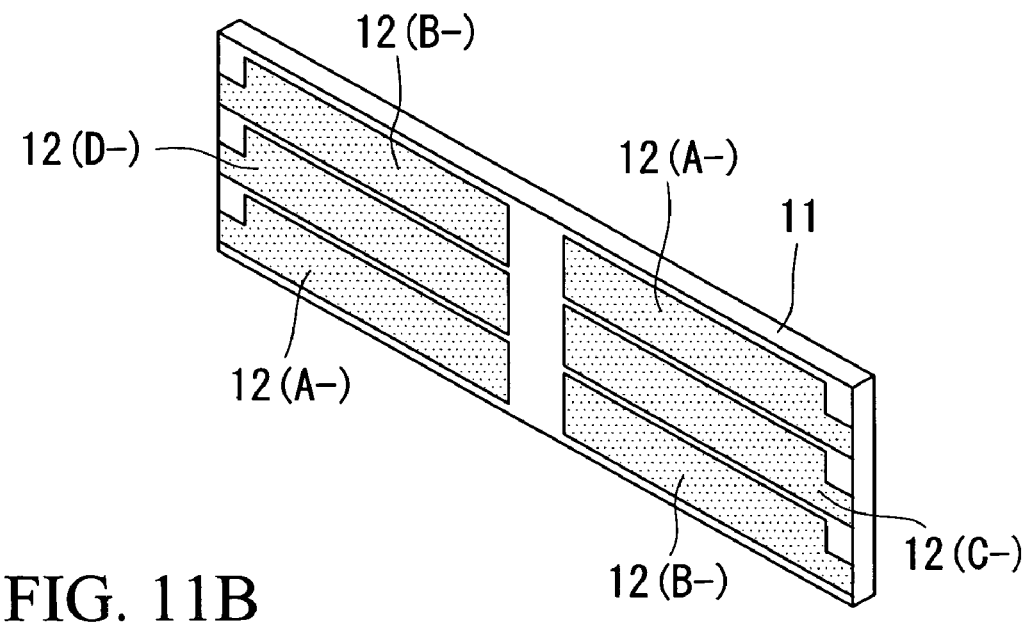
FIG. 11A is a perspective diagram showing a piezoelectric ceramic sheet constituting a piezoelectric layered member in FIG. 10.
Figure 11B:
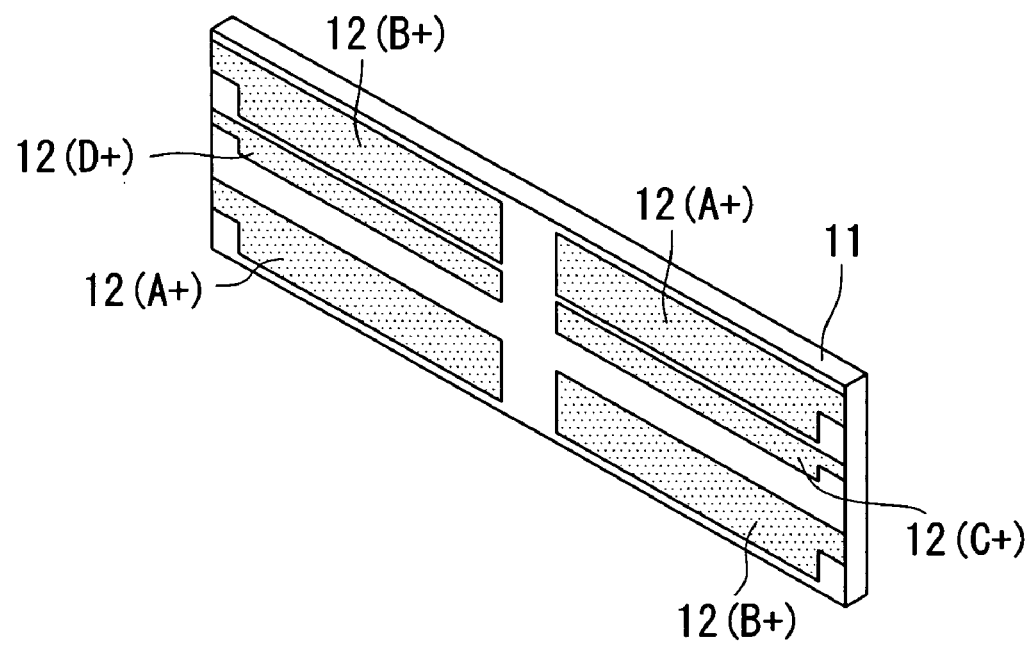
FIG. 11B is a perspective diagram showing a piezoelectric ceramic sheet constituting the piezoelectric layered member in FIG. 10.

As shown in FIGS. 10 to 11B, the ultrasonic motor according to this embodiment differs from the ultrasonic motors according to the first and second embodiments described above in that it includes an ultrasonic vibrator 40 in which C-phase and D-phase inner electrodes for vibration detection are provided.

The piezoelectric ceramic sheet 11 shown in FIG. 11A has inner electrodes 12 on substantially the entire surface thereof. The inner electrodes 12 include two columns of electrodes disposed in the longitudinal direction and three rows of electrodes disposed in the width direction, all having substantially the same size. The inner electrodes 12 are separated in the longitudinal direction of the piezoelectric ceramic sheet 11 by an insulating distance of about 0.4 mm and are separated in the width direction of the piezoelectric ceramic sheet 11 by an insulating distance of about 0.4 mm. The inner electrodes 12 are disposed with a gap of about 0.4 mm from the edges of the piezoelectric ceramic sheet 11, and portions thereof extend to the edges of the piezoelectric ceramic sheet 11.

In the piezoelectric ceramic sheet 11 shown in FIG. 11B, the widths of the inner electrodes 12 located at the central position in the width direction are about half of those shown in FIG. 11A.

A rectangular-block-shaped piezoelectric layered member 43 is formed by alternately laminating a plurality of the piezoelectric ceramic sheets 11 with the large inner electrodes 12, shown in FIG. 1A, and a plurality of the piezoelectric ceramic sheets 11 with the small inner electrodes 12, shown in FIG. 11B.

A total of twelve external electrodes 17 are provided on the piezoelectric layered body 43, six on each end face in the longitudinal direction. All of the inner electrodes 12 that are disposed at the same position in the same type of piezoelectric ceramic sheet 11 are connected to a corresponding external electrode 17. Accordingly, the inner electrodes 12 that are disposed at the same position on the same type of piezoelectric ceramic sheet 11 have the same potential. These external electrodes 17 are connected to a controller (not shown in the drawings) via wiring lines (not shown in the drawings). The wiring lines may be any type of flexible wiring, such as leads or flexible substrates.

The six external electrodes 17 formed at one end in the longitudinal direction of the piezoelectric layered body 43 are A-phase (A+ and A−), C-phase (C+ and C−), and B-phase (B+ and B−) electrodes in this order from the other side face (the top side in FIG. 2) of the piezoelectric layered member 43, and the six external electrodes 17 formed at the other end are B-phase (B+ and B−), D-phase (D+ and D−), and A-phase (A+ and A−) electrodes in this order from the other side face (the top side in FIG. 2) of the piezoelectric layered body 43. The A-phase and B-phase external electrodes are for driving, and the C-phase and D-phase external electrodes are for vibration detection.

By applying AC voltages corresponding to resonant frequencies and having synchronous phases to the A-phase and B-phase external electrodes 17, a first-order longitudinal vibration is excited, as illustrated in FIG. 5. By applying AC voltages corresponding to resonant frequencies and having opposite phases to the A-phase and B-phase external electrodes 17, a second-order flexural vibration is excited, as illustrated in FIG. 6. FIGS. 5 and 6 show computer analysis results obtained by a finite element method.

The sum of the signal output from the C-phase and D-phase electrodes is proportional to the longitudinal vibration, and the difference between the signals output from the C-phase and D-phase electrodes is proportional to the flexural vibration. These calculations are carried out by the controller described above.

With the ultrasonic motor according to this embodiment, by connecting the C-phase terminal (C+) and the D-phase terminal (D+) and by connecting the C-phase terminal (C−) and the D-phase terminal (D−), it is possible to detect a signal proportional to the longitudinal vibration mode from this pair of signal lines. In addition, by connecting the C-phase terminal (C+) and the D-phase terminal (D−) and by connecting the C-phase terminal (C−) and the D-phase terminal (D+), it is possible to detect a signal proportional to the flexural vibration mode from this pair of signal lines. In other words, it is possible to easily detect both the longitudinal vibration mode and the flexural vibration mode without using a special device.

By setting the frequency close to a frequency at which the amplitude of the longitudinal vibration or the amplitude of the flexural vibration of the vibrator is maximized, it is possible to drive the ultrasonic motor more efficiently, and a higher motor output can be obtained.

An ultrasonic motor according to a fourth embodiment of the present invention will be described below with reference to FIGS. 12 to 13B.

Figure 13A:
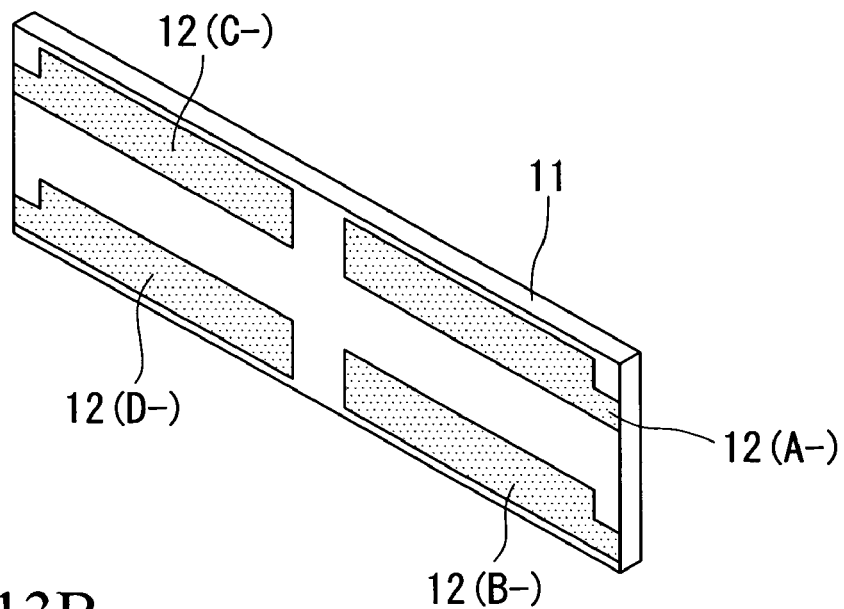
FIG. 13A is a perspective view showing a piezoelectric ceramic sheet constituting a piezoelectric layered member in FIG. 12.
Figure 13B:
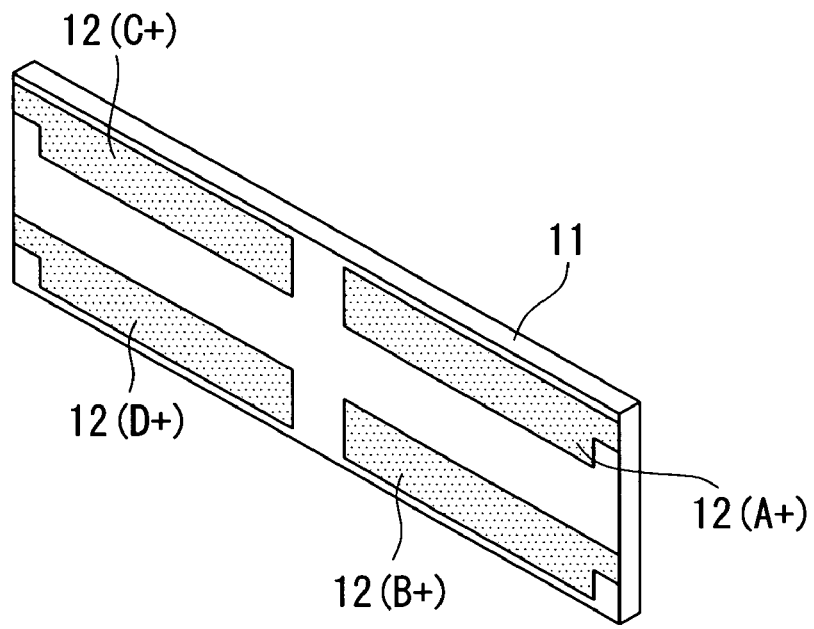
FIG. 13B is a perspective view showing a piezoelectric ceramic sheet constituting the piezoelectric layered member in FIG. 12.

As shown in FIGS. 13A and 13B, the ultrasonic motor according to this embodiment differs from the ultrasonic motor according to the third embodiment described above in the following points. There is provided an ultrasonic vibrator 50 in which the inner electrode 12 disposed at the center in the width direction of the ceramic sheet 11 is omitted. One of the A-phase terminals (A+, disposed at the lower left in FIG. 11B) is used as a D-phase terminal (D+), one of the A-phase terminals (A−, disposed at the lower left in FIG. 11A) is used as a D-phase terminal (D−), one of the B-phase terminals (B+, disposed at the upper left in FIG. 11B) is used as a C-phase terminal (C+), and one of the B-phase terminals (B−, disposed at the upper left in FIG. 11A) is used as a C-phase terminal (C−).

With the ultrasonic motor according to this embodiment, it is possible to simplify the construction of the inner electrodes 12, and it is possible to simplify the construction of the piezoelectric layered member 53.

The other effects and advantages of this embodiment are the same as those of the third embodiment described above, and a description thereof is thus omitted here.

Figure 14:
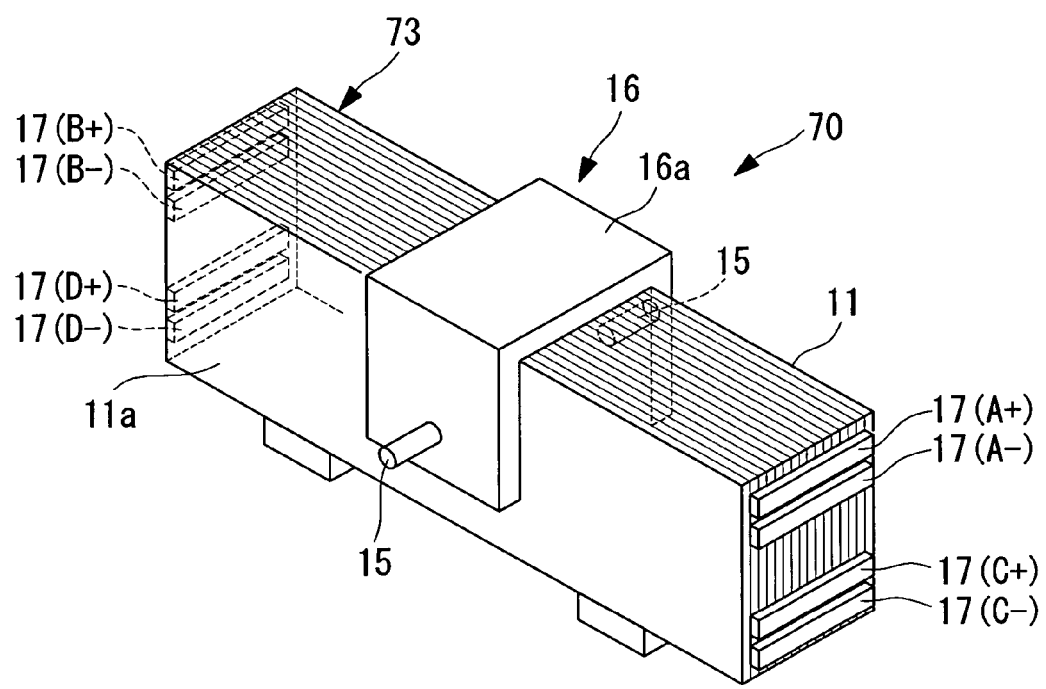
FIG. 14 is a perspective view showing an ultrasonic vibrator in an ultrasonic motor according to a fifth embodiment of the present invention.

An ultrasonic motor according to a fifth embodiment of the present invention will be described below with reference to FIGS. 14 to 15B.

Figure 15A:
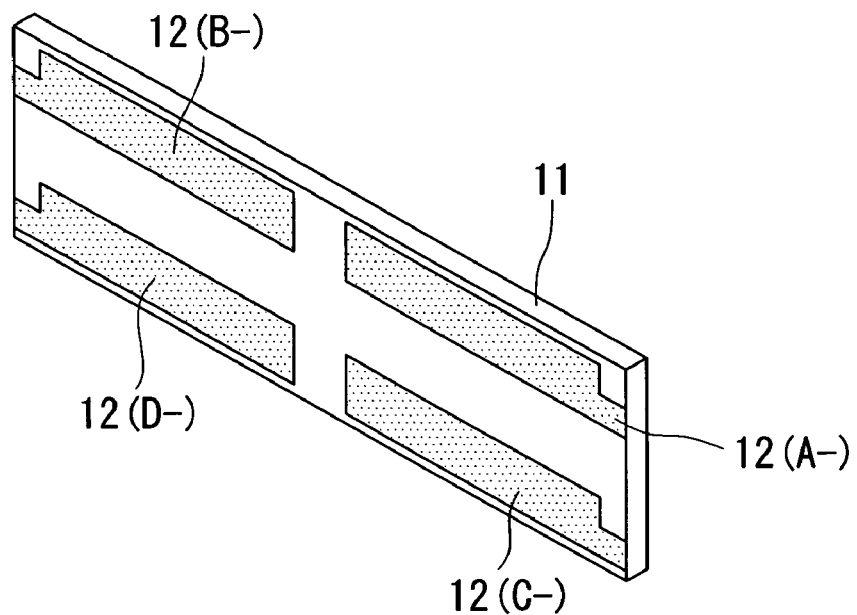
FIG. 15A is a perspective diagram showing a piezoelectric ceramic sheet constituting a piezoelectric layered member in FIG. 14.
Figure 15B:
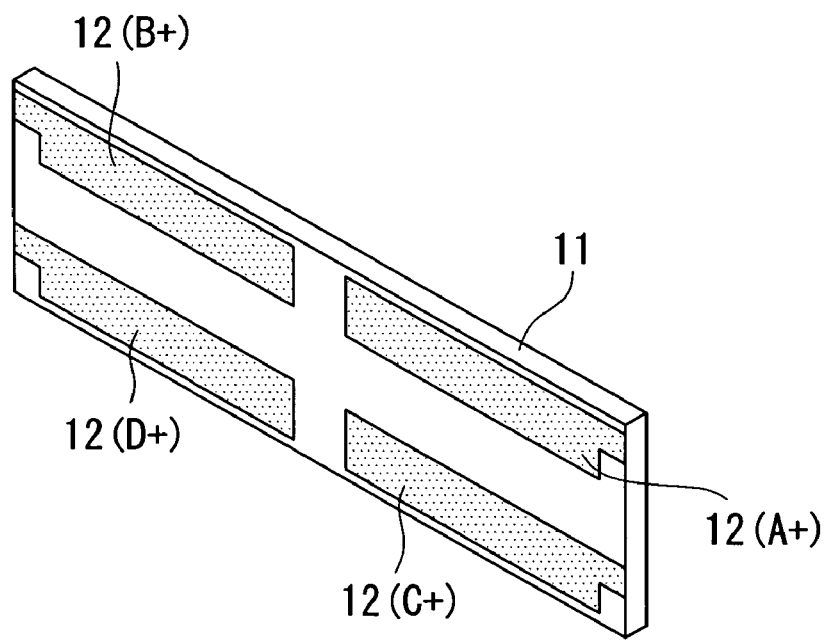
FIG. 15B is a perspective diagram showing a piezoelectric ceramic sheet constituting the piezoelectric layered member in FIG. 14.

As shown in FIGS. 15A and 15B, the ultrasonic motor according to this embodiment differs from the ultrasonic motor according to the third embodiment described above in the following points. There is provided an ultrasonic vibrator 70 in which the inner electrode 12 disposed at the center in the width direction of the ceramic sheet 11 is omitted. One of the A-phase terminals (A+, disposed at the lower left in FIG. 11B) is used as a D-phase terminal (D+), one of the A-phase terminals (A−, disposed at the lower left in FIG. 11A) is used as a D-phase terminal (D−), one of the B-phase terminals (B+, disposed at the lower right in FIG. 11B) is used as a C-phase terminal (C+), and one of the B-phase terminals (B−, disposed at the lower right in FIG. 11A) is used as a C-phase terminal (C−).

With the ultrasonic motor according to this embodiment, it is possible to simplify the construction of the inner electrodes 12, and it is possible to simplify the construction of the piezoelectric layered member 73.

The other effects and advantages of this embodiment are the same as those of the third embodiment described above, and a description thereof is thus omitted here.

In the embodiments described above, PZT is used as the piezoelectric ceramic sheets; the invention is not limited to this, however, and any piezoelectric elements other than PZT elements may be used so long as they exhibit piezoelectric characteristics.

In the embodiments described above, a palladium-silver alloy is used as the material of the inner electrodes; however, silver, nickel, platinum, or gold may be used instead.

Furthermore, instead of bonding a sliding plate formed of zirconia ceramic to the rear surface of the driven body 2, the zirconia ceramic may be attached to the rear surface of the driven body 2 by plasma spraying.

Furthermore, in the embodiments described above, the inner electrodes for vibration detection are provided on all layers; however, the present invention is not limited to this, and they may be provided on only a single layer or on several layers.

What is claimed is:

1. An ultrasonic motor comprising:
electromechanical transducers for driving;
electromechanical transducers for vibration detection; and
an ultrasonic vibrator in which, by supplying two-phase AC voltages with a predetermined phase difference and a predetermined driving frequency to the electromechanical transducers for driving, a longitudinal vibration mode and a flexural vibration mode are simultaneously generated to produce a substantially elliptical vibration at an output,
wherein the ultrasonic motor includes a piezoelectric layered member which is made up of a stack of a rectangular-block-shaped piezoelectric ceramic sheets,
wherein each of the piezoelectric ceramic sheets includes two columns of inner electrodes disposed in a longitudinal direction and three rows of the inner electrodes disposed in the width direction thereon,
wherein an electromechanical transducer for driving is composed of two pairs of inner electrodes diagonally opposite to each other on the piezoelectric ceramic sheet, in which one pair of the inner electrodes is composed of A-phase electrodes and the other pair of the inner electrodes is composed of B-phase electrodes,
wherein one inner electrode of a pair of the inner electrodes disposed along the longitudinal direction of the piezoelectric ceramic sheet at the central area in the width direction of the piezoelectric ceramic sheet is a C-phase electrode, and the other inner electrode is a D-phase electrode,
wherein an electromechanical transducer for vibration detection is composed of the C-phase electrode and the D-phase electrode disposed at positions where the total of the electrical charges generated in each region due to the longitudinal vibration mode is finite and the difference between the charges generated in each region due to the longitudinal vibration mode is zero, and where the total of the electrical charges generated in each region due to the flexural vibration mode is zero and the difference between the charges generated in each region due to the flexural vibration mode is finite, and
wherein the electromechanical transducers for vibration detection independently detect both the longitudinal vibration mode and the flexural vibration mode, wherein the longitudinal vibration mode and the flexural vibration mode are simultaneously generated by supplying two-phase alternating voltages to the electromagnetic transducer for driving.

2. An ultrasonic motor comprising:
electromechanical transducers for driving;
electromechanical transducers for vibration detection; and
an ultrasonic vibrator in which, by supplying two-phase AC voltages with a predetermined phase difference and a predetermined driving frequency to the electromechanical transducers for driving, a longitudinal vibration mode and a flexural vibration mode are simultaneously generated to produce a substantially elliptical vibration at an output, wherein the ultrasonic motor includes a piezoelectric layered member which is made up of a stack of rectangular-block-shaped piezoelectric ceramic sheets, wherein two pairs of inner electrodes are positioned diagonally opposite to each other on the piezoelectric ceramic sheet, wherein one pair of the inner electrodes is composed of a A-phase electrode and a D-phase electrode, wherein the other pair of the inner electrodes is composed of a B-phase electrode and a C-phase electrode, wherein an electromechanical transducer for vibration detection is composed of the C-phase electrode and the D-phase electrode disposed at positions where the total of the electrical charges generated in each region due to the longitudinal vibration mode is finite and the difference between the charges generated in each region due to the longitudinal vibration mode is zero, and where the total of the electrical charges generated in each region due to the flexural vibration mode is zero and the difference between the charges generated in each region due to the flexural vibration mode is finite, and wherein the electromechanical transducers for vibration detection independently detect both the longitudinal vibration mode and the flexural vibration mode, where the longitudinal vibration mode and the flexural vibration mode are simultaneously generated by supplying two-phase alternating voltages to the electromagnetic transducer for driving.

* * * * *